United States Patent
Linss

(10) Patent No.: US 6,288,614 B1
(45) Date of Patent: Sep. 11, 2001

(54) PHASE-LOCKED LOOP WITH IMPROVEMENTS ON PHASE JITTER, MTIE TRACKING SPEED AND LOCKING SPEED

(75) Inventor: Bernd Linss, Bad Salzdetfurth (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/564,940

(22) Filed: May 4, 2000

Related U.S. Application Data

(63) Continuation of application No. PCT/EP98/07078, filed on Nov. 5, 1998.

(30) Foreign Application Priority Data

Nov. 5, 1997 (DE) .............................................. 197 48 885

(51) Int. Cl.[7] ................................................ H03L 7/197
(52) U.S. Cl. ............................................ 331/16; 331/25
(58) Field of Search ........................................ 331/16, 25

(56) References Cited

U.S. PATENT DOCUMENTS

| | | | |
|---|---|---|---|
| 4,516,083 | 5/1985 | Turney | 331/1 A |
| 5,107,220 * | 4/1992 | Andoh | 327/41 |
| 5,144,254 | 9/1992 | Wilke | 331/2 |
| 5,256,980 | 10/1993 | Itri | 327/105 |
| 5,420,545 * | 5/1995 | Davis et al. | 331/17 |

FOREIGN PATENT DOCUMENTS

| | | |
|---|---|---|
| 39 39 709 A1 | 6/1991 | (DE) . |
| 57 20037 | 2/1982 | (JP) . |

\* cited by examiner

*Primary Examiner*—Siegfried H. Grimm
(74) *Attorney, Agent, or Firm*—Nixon & Vanderhye P.C.

(57) ABSTRACT

The phase locked loop (PLL) of the invention comprises a first divider (DIV1), a second divider (DIV2), a phase detection means (PFD) and an oscillator means (VCO) connected in a PLL loop configuration. The first divider (DIV1) and the second divider (DIV2) each have at least two different selectable frequency factors (a, b; c, d). A control means (CTPL) switches between pairs of frequency division factors selected respectively from both dividers (DIV1, DIV2) according to a predetermined switching pattern (Z). The usage of at least two different pairs of frequency division factors in the dividers (DIV1, DIV2) allows a high phase resolution, a fast tracking speed and a fine adjustment of the frequency/phase of the output signal of the voltage-controlled oscillator (VCO) in steps of ppm.

21 Claims, 7 Drawing Sheets

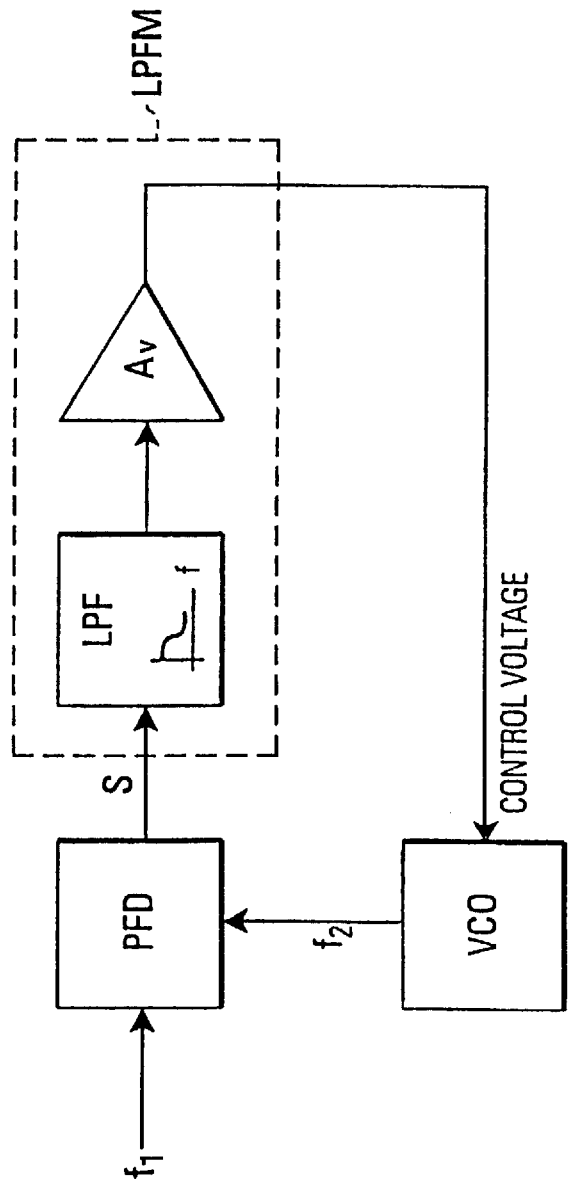
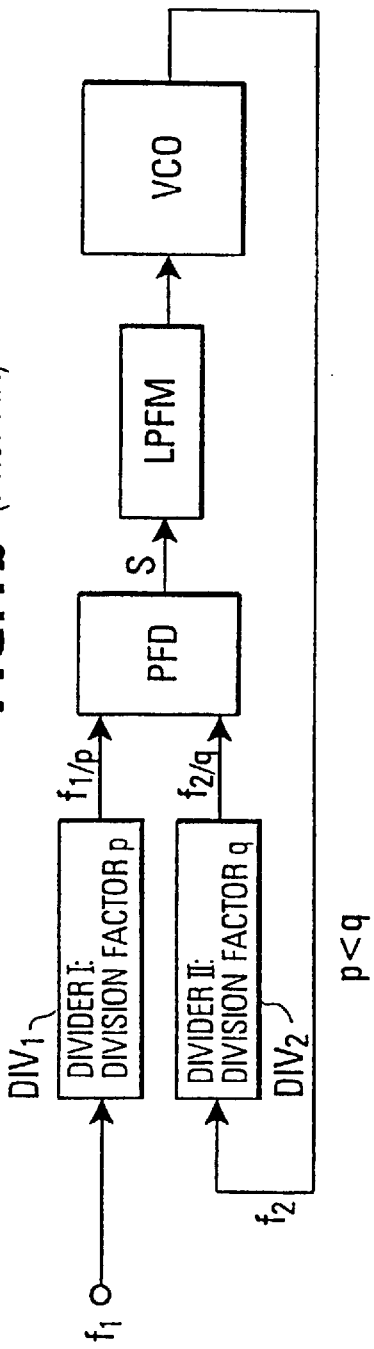

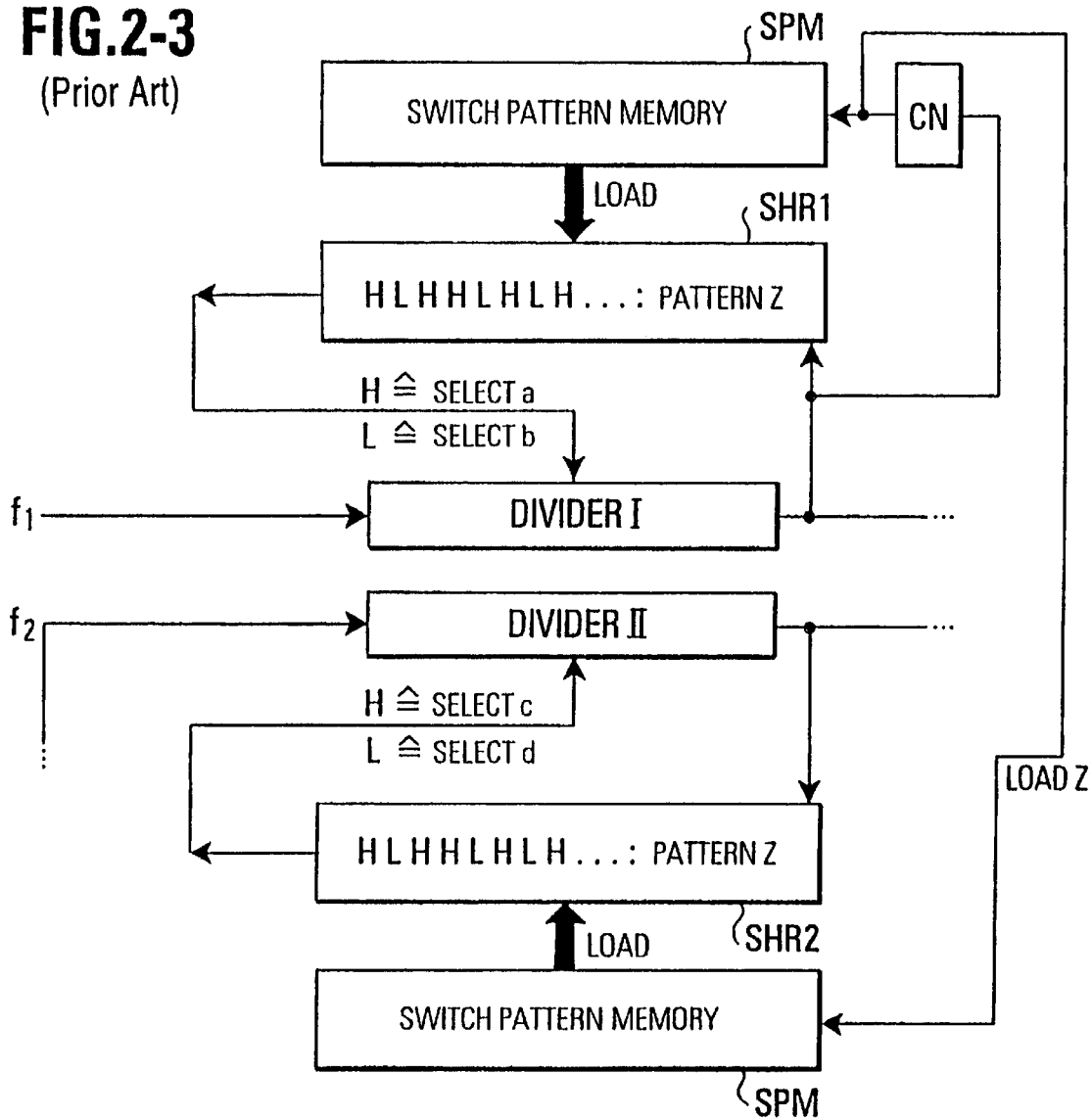

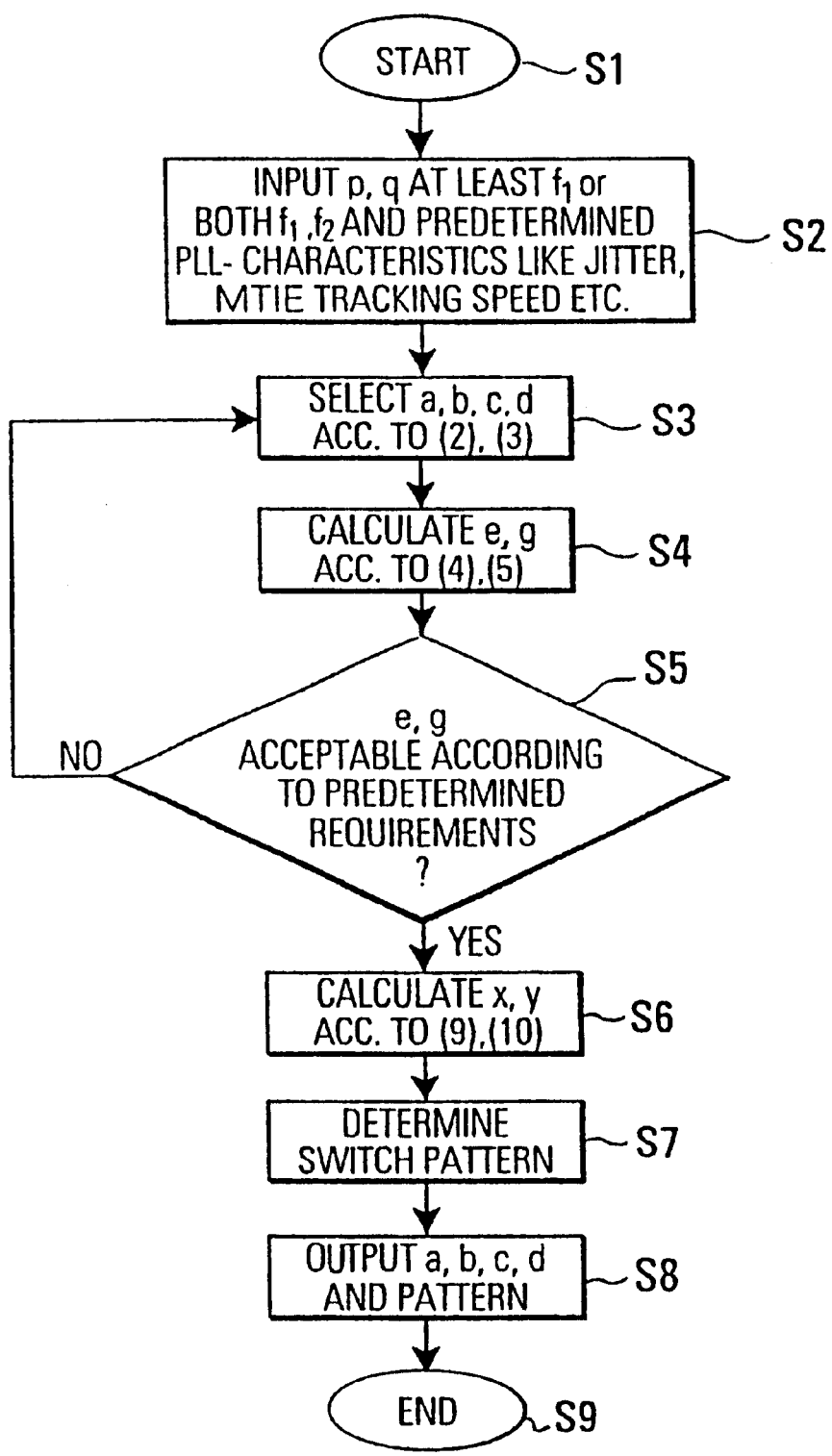

OPTIMIZED PATTERN Z
AS IN FIG.3-2

| VARIABLE | DIFFERENT USAGES, VARIABLES ACCORDING TO FIGURE 2 | | | | | |
|---|---|---|---|---|---|---|
| | EX1: FAST TRACKING I | EX2: FAST TRACKING II | EX3: JITTER REDUCED I | EX4: JITTER REDUCED II | EX5: ADJUSTMENT IN ppm I | EX6: ADJUSTMENT IN ppm II |
| p | 2*5*13*23 = 2990 | | | | $2990*10^3$ | $2990*10^6$ |
| q | 3*7*17*19 = 6783 | | | | $6783*10^3 + 1$ | $6783*10^6 + 1$ |
| a | 3 | 7 | 59 | 152 | 59 | |
| b | 2 | 9 | 34 | 245 | 34 | |
| c | 1 | 3 | 26 | 67 | 26 | |
| d | 1 | 4 | 15 | 108 | 15 | |
| ad-bc | 3*1-2*1 = 1 | 7*4-9*3 = 1 | 59*15-34*26 = 885-884 = 1 | 152*67-245*108 = 16416-16415 = 1 | 59*15-34*26 = 885-884 = 1 | |
| e | 0,322.424 | 0,085.655 | 0,007.666 | 0,002.80 | 0,007.666 | |
| -g | -0,118.384 | -0,032.729 | -0,012.531 | -0,002.064 | -0,012.531 | |
| x | 803 | 581 | 52 | 14 | $52*10^3 - 26$ = 51974 | $52*10^6 - 26$ = 51.999.974 |
| y | 2187 | 222 | 85 | 19 | $85*10^3 + 15$ = 85.015 | $85*10^6 + 15$ = 85.000.015 |
| x+y | 2990 | 803 | 137 | 33 | 136.989 | 136.999.989 |

DIVIDER:DIV1    bababab bababab bababab

SWITCH PATTERN    HLHLHLH HLHLHLH HLHLHLH : $F_{1,2}$; 14,19

DIVIDER DIV2    dcdcdcd dcdcdcd dcdcdcd

SELECTED PAIR    $P_2 P_1 P_2$ ......

x TIMES $P_1$ : 14
y TIMES $P_2$ : 19 e,g HAS ZERO
AFTER A LENGTH
Z OF SWITCHINGS
$[+1, -1]$
$I = Z/2q$
$= 0,24\%!$

PHASE-LOCKED LOOP WITH IMPROVEMENTS ON PHASE JITTER, MTIE TRACKING SPEED AND LOCKING SPEED

This is a continuation of PCT application No. PCT/EP98/07078, filed Nov. 5, 1998, the entire content of which is hereby incorporated by reference in this application.

FIELD OF THE INVENTION

The invention relates to a phase-locked loop for generating an output signal which has a predetermined frequency and a locked phase relative to a reference signal of a predetermined reference frequency. The invention relates to a phase-locked loop enabling to increase the cut-off frequency or the low pass filter and the resolution of the phase/frequency discriminator, in particular for a low meantime interval error (MTIE), a low phase-jitter even at low frequencies and a fast tracking speed and a minimum time for locking to the reference frequency.

BACKGROUND OF THE INVENTION

The phase-locked loop (PLL) is a useful building block available from several manufacturers as a single integrated circuit. A phase-locked loop PLL typically contains a phase detector PFD, an amplifier $A_V$, a low pass filter LPF (both contained in a low pass filter means LPFM) and a voltage-control oscillator VCO as is schematically shown in FIG. 1a. In a phase-locked loop a mixture of digital and analogue techniques are combined in one package. The phase-locked loop finds broad applications in tone decoding, demodulation of AM and FM signals, frequency multiplication, frequency synthesis, pulse synchronization of signals from noisy sources, e.g. magnetic tape, and regeneration of "clean" signals.

The basic operation of the phase-locked loop is as follows. The phase detector PFD is a device that compares two input frequencies, i.e. the predetermined frequency f2 of an output signal from the voltage controlled oscillator and a predetermined reference frequency f1 of a reference signal f1. The phase detector generates an output that is a measure of the phase difference between the two signals f1, f2 (if, for example, they differ in frequency, it gives a periodic output at the difference frequency). If f1 is not equal to f2 the phase deviation signals, after being filtered and amplified in the low pass filter means LPFM, causes the voltage-controlled oscillator frequency to deviate in the direction of f1. If the operating conditions are correctly set, the voltage-controlled oscillator will quickly "lock" its output frequency f2 to the reference frequency f1, maintaining a fixed phase relationship with the input signal.

The generated control voltage input to the VCO is a measure of the output frequency f2. The VCO output is a locally generated frequency, in the simplest case equal to f1 thus providing a clean replica of f1, which may itself be noisy. The wave forms of f1, f2 are not restricted to any particular waveform, i.e. the VCO output signal can be a triangle wave, sign wave or any other wave. Therefore, the phase locked loop PLL provides an easy technique, for example to generate a sign wave locked to a train of input pulses.

Since the phase detector PFD compares the phase (or frequency) of the reference frequency f1 with the predetermined frequency f2 output by the voltage controlled oscillator the phase deviation signal S is a signal which—dependent on the tracking behavior of the phase-locked loop PLL—assumes values according to the phase/frequency deviation between f1 and f2.

STATE OF THE ART

To allow a more flexible design of the afore mentioned parameters and to allow a generation of output frequencies f2 at a multiple of the reference frequency f1 and also to improve on the afore mentioned parameters, it is conventional practice to provide dividers for dividing the predetermined frequency f2 and the reference frequency f1 by respective frequency division factors p, q in two dividers DIV1, DIV2 provided in front of the phase detection means PFD as is illustrated in FIG. 1b. FIG. 1b shows features of as known from U.S. Pat. No. 5,256,980. In this document, as FIG. 1b, two frequency dividers are provided, whereby each of them has particular division factors m, m+1, m−1 and n, n−1, n+1. The purpose in this prior art document is to keep the rising edges of the two clock signals in time alignment. That is, the nominal values n, m are only changed by ±1 in order to keep the rising edges in time alignment. This switching of ±1 allows to finally adjust the phase of the synthesizer output and/or its frequency.

In FIG. 1b, with an appropriate selection of the frequency division factors p, q, the phase detection means PFD compares divided frequencies f1/p and f2/q to obtain the phase deviation signal S. There are also realizations where only one divider DIV1 is used. It is clear from FIG. 1b that with the appropriate selection of p, q together with an appropriate selection of the cut-off frequency and the filter characteristic of the low pass filter LPF and the amplification $A_v$, the tracking speed, the locking speed, the MTIE (meantime interval error) as well as the phase-jitter can be influenced. Having divided the frequencies f1, f2 by appropriate frequency factors p, q desired frequency ratios can be adjusted.

The output of the phase detector PFD (which can e.g. be a mixer or a flip-flop), i.e. the phase deviation signal S, comprises a spectrum containing the control information in a lower frequency region thereof. To extract this control information, the spectrum is low pass-filtered by the low pass filter LPF having a cut-off frequency given by the particular application. When a large number of phase comparisons is performed in a given time, i.e. when the frequencies f1/p, f2/q are large, then the spectrum is quite broad, the cut-off frequency of the low pass filter LPF can be quite large and it is sufficient to use a low pass filter of a comparatively simple configuration (6 dB/decade), since the higher spectral components are far away from the application dependent low pass filter cut-off frequency. By contrast, when over a given period of time only a small number of phase comparisons can be performed, i.e. when the frequencies f1/p, f2/q are comparatively small, then the spectrum is rather narrow and it is necessary to select a low cut-off frequency of the low pass filter LPF and to use low pass filters of a rather complicated design. (e.g. 30 to 40 dB/decade), since the higher spectral components are rather closely located to the application dependent low pass filter frequency.

Depending on the cut-off frequency and the selected filter design, the output of the low pass filter means LPFM may still contain spectral components which have not been sufficiently suppressed by the low pass filter LPF. Even if complicated filter designs are used, e.g. switched capacitor filters having a very steep slope, the switching frequency may occur as spectral component in the output of the low pass filter means LPFM. Furthermore, there may be other distortion and noise components in the output of the low pass filter means LPFM which have not been sufficiently suppressed by the LPF. Such effects cause a phase-jitter in the output of the voltage-controlled oscillator VCO, i.e. a variation of the output signal frequency f2. Furthermore, the voltage-controlled oscillator is—even in the absence of an input control voltage—not totally stable, which causes a further intrinsic phase-jitter in the output signal frequency f2.

Moreover, the choice of the cut-off frequency and of the filter characteristic does not only influence the sufficient suppression of spectral components and other noise components in the output of the LPF, but also influences the tracking and locking behaviour of the entire phase-locked loop. Therefore, also regarding the maximum tracking speed and the time needed for the PLL for locking to the reference and the meantime interval error, the selection of the cut-off frequency of the LPF with respect to the frequencies f1/p, f2/q is important, in particular when f1/p and f2/q are small frequencies such that only a small number of phase comparisons can be performed.

Drawbacks of the PLL Using Two Dividers DIV1, DIV2

As explained above, the relationship between the various afore mentioned parameters is of utmost importance in order to achieve the desired operational condition of the PLL. In particular, there is always a trade-off between the phase-jitter, the MTIE and the maximum tracking speed as well as the time needed for the locking of the PLL.

Depending on the available reference frequency f1 and the desired frequency f2 problems in particular occur for large values of p, q without common dividers. Then the configuration in FIG. 1b has the disadvantage of high delays and dead zones; that is, with high values of p, q a considerable time will be needed until the phase locked loop PLL locks caused by the required low cut-off frequency of the low pass filter LPF.

Thus, in particular for large values of p, q (i.e. small frequencies for comparison at the PFD) such PLLs suffer in principle from a low response time and also from a low tracking speed after changes in the frequency of phase of the voltage controlled oscillator or in the reference frequency have occurred. Thus, even if an optimized relationship for p, q, f1, f2 and the cut-off frequency of the low pass filter LPF is found to achieve one particular operation characteristic, there is still a trade-off since not all other operation conditions as explained above can be optimized at the same time. Therefore, the PLL configuration of FIG. 1b essentially suffers from the following main disadvantages:

1. Apart from the generation of large phase-jitters in particular at low frequencies, a large meantime interval error MTIE (defined as the mean phase error averaged over several periods of the frequencies f1; f2) is generated. This is even true when more expensive voltage-controlled oscillators are used with good short time stability. For some applications the usage of low-cost LC- or RC-oscillators is nearly totally excluded.
2. The maximum tracking speed (e.g. needed for sweepers) is limited by the cut-off frequency of the low pass filter LPF.
3. The locking speed or the minimum time needed by the phase locked loop for locking the frequency f2 to the reference frequency f1 is also limited by the cut-off frequency of the low pass filter LPF.
4. It is not possible to adjust the frequency $f_2$ output by the voltage controlled oscillator in steps of ppm (parts per million) due to the comparatively long response time caused by the cut-off frequency of the low pass filter LPF.

A small improvement of the above described disadvantages can be achieved if one of the frequency division factors $\bar{p}$, q ($\bar{p}<p$) is slightly changed by a control means, e.g. $p \rightarrow p+1$. Also other procedures using mixing methods require highly sophisticated filters, i.e. filters of higher order, which may additionally require a manual fine tuning after manufacture.

SUMMARY OF THE INVENTION

As explained above in the conventional design shown in FIG. 1b an adjustment of the voltage-controlled oscillator in steps of ppm, a fast tracking behavior of the voltage-controlled oscillator with providing simultaneously a high phase stability and a fast locking of the PLL is difficult, in particular with large values of p, q without common dividers.

However, in the conventional PLL only the values p, q and the cut-off frequency of the low-pass filter as well as the filter characteristic and amplification constitute the main design parameters for optimizing the PLL-design. The choice of these parameters must simultaneously optimize the following three criteria:

a) The maximum acceptable phase-error defined by the phase-jitter requirements;
b) The comparison frequencies and the phase resolution caused by the choice of frequency division factors; and
c) The cut-off frequency of the low-pass filter LPF because of the tracking and phase-jitter behaviors.

Therefore, in the conventional design, either the low-pass filter design is very complicated or the phase resolution of the PLL is insufficient.

Therefore, the object of the present invention is
to provide a phase-locked loop (PLL) which can achieve a high phase resolution and a fast tracking and locking speed without needing a complicated low-pass filter design.

This object is solved by a phase-locked loop comprising the features disclosed below.

According to the invention, it has been realized that a higher phase resolution, a higher tracking speed as well as a fine adjustment in steps of ppm can be realized, if the dividers are modified, i.e. such that each divider has a plurality of at least two different selectable frequency division factors. A control means is provided for respectively choosing one frequency division factor for each divider. The pairs of frequency division factors are then switched according to a predetermined switching pattern.

According to the invention, it was not only realized that more design freedom for the solution of the afore mentioned problems can be achieved by expanding the frequency division factors into a plurality of frequency division factors to be used alternately by each divider, but that a predetermined switching pattern can always be found such that the phase error can be kept in such small limits that allow an adjustment of the phase locked loop in steps of ppm. The invention has left the conventional path of trying to achieve an optimization of the phase locked loop in terms of adjusting f1, f2 (p, q) together with the cut-off frequency or the filter characteristic. If several frequency division factor pairs are switched according to the switching pattern, there are significant simplifications in the low-pass filter design while still an increased phase resolution can be achieved.

According to a specific aspect of the invention, each divider contains only two selectable frequency division factors a, b; c, d and the switching pattern is used for switching between these two pairs. Already two frequency division factors are sufficient for achieving the improvement of the phase resolution.

Further advantageous embodiments and improvements of the invention may be found in the description that follows. Hereinafter, the invention will be further illustrated with reference to its embodiments and with reference to the attached drawings.

BRIEF DESCRIPTION OF THE DRAWINGS

In the drawings, the same or identical reference numerals designate the same or similar parts throughout the drawings.

FIG. 1a shows a general block diagram of a conventional phase-locked loop including a phase detector PFD, a low pass filter means LPFM and a voltage controlled oscillator VCO;

FIG. 1b shows a block diagram of a conventional phase-locked loop where a first and second divider DIV1, DIV2 are used for dividing the output signal f2 and the reference signal f1 by one single frequency division factor p, q, respectively;

FIG. 2-2 shows an embodiment of the control means in FIG. 2 using two shift registers SHR1, SHR2 containing respectively the switch pattern Z;

FIG. 2-3 shows an embodiment of the control means using two shift registers SHR1, SHR2 and a switch pattern memory SPM as well as a counter CN;

FIG. 2-4 shows a method for determining the divider factors a, b, c, d and the switch pattern X, Y, Z;

FIG. 3-1 shows various examples EX1–EX6 using two pairs of frequency division factors illustrating situations for a fast tracking, reduced jitter and a fine adjustment in steps ppm; and FIG. 3-2 shows an optimized switching pattern Z for the example EX4 in FIG. 3-1.

PRINCIPLE OF THE INVENTION

Figures 1, 2:
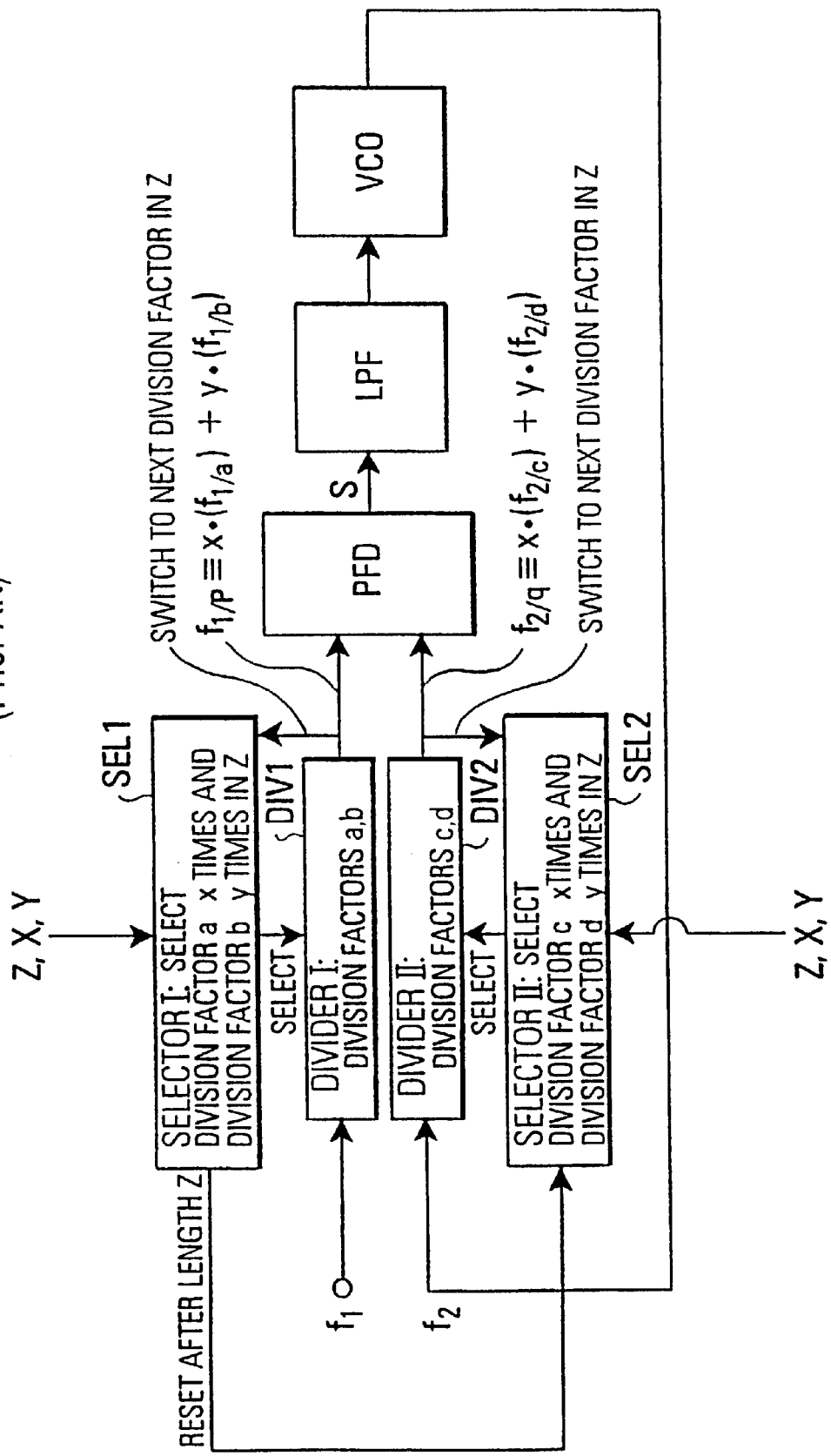
FIG. 2-1 shows an embodiment of the phase-locked loop using two frequency division factors per divider together with a control means SEL1, SEL2 for switching between the two pairs of frequency division factors according to a predetermined switching pattern Z.
Figure 2:
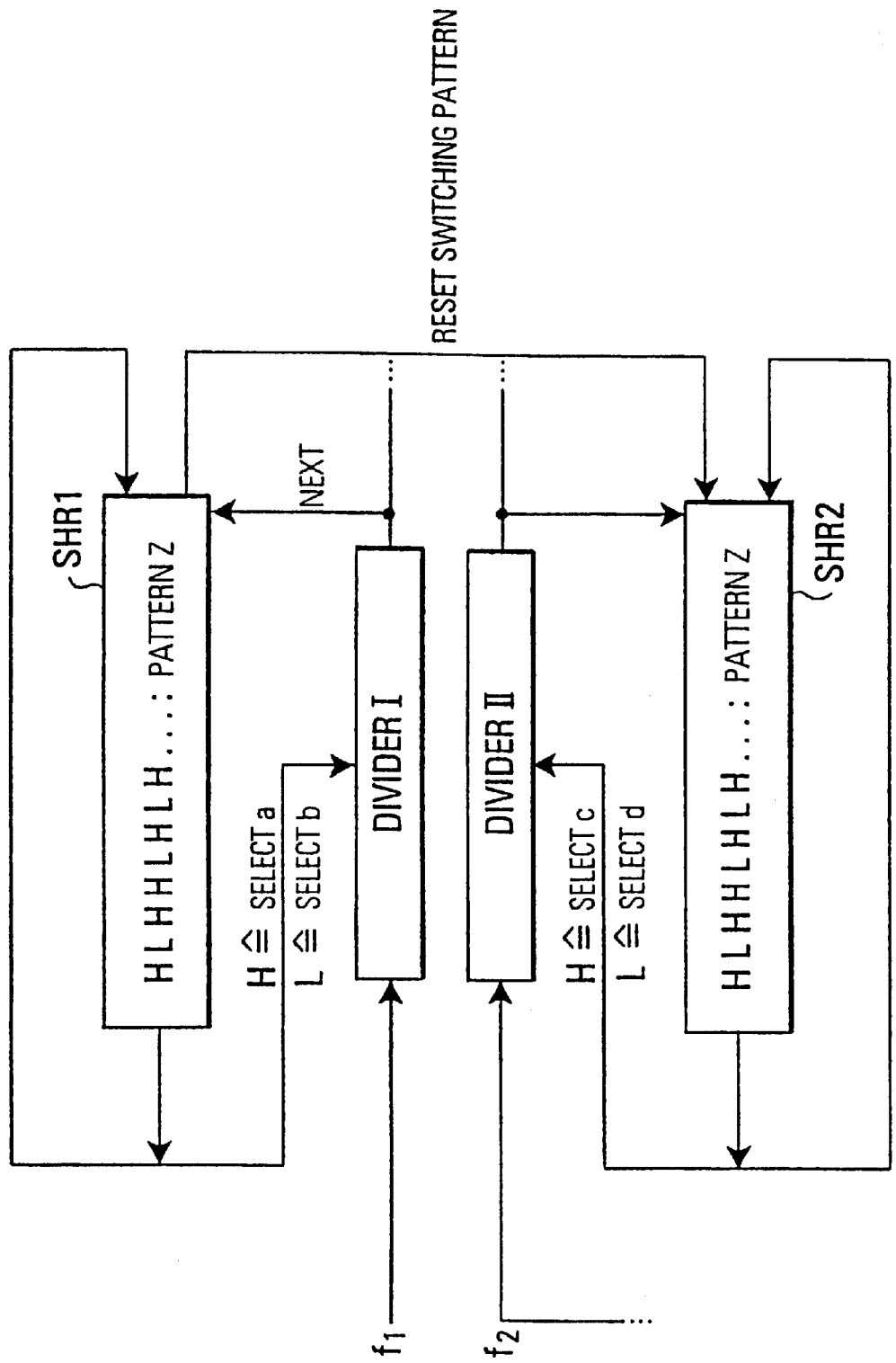

According to the invention, each frequency divider DIV1, DIV2 in FIG. 1b contains a plurality of at least two different frequency division factors a, b; c, d for respectively dividing the reference frequency f1 and the predetermined frequency f2. At any point in time, a predetermined pair of frequency division factors consisting of one frequency division factor of said first divider and one frequency division factor of said second divider is selected. The respective pairs are pre-defined. A switching pattern which is predetermined is used for switching between the individual selected pairs.

For example, the first divider DIV1 comprises frequency division factors $a_1, a_2, \ldots a_n$ and the second divider DIV2 contains frequency division factors $b_1, b_2, \ldots b_n$. Pairs $P_n$ of the frequency division factors a, b are predefined, that is: $P_1=(a_1, b_1)$, $P_2=(a_2, b_2)$, ... $P_n=(a_n, b_n)$. The frequency division factor $a_n$ and the frequency division factor $b_n$ can be arbitrarily selected whereby it is assumed that $a_1, a_2 \ldots a_n$, $b_1, b_2, \ldots b_n$ are natural numbers and $b_1<a_1, b_2<a_2, \ldots b_n<a_n$. An optimized switching pattern can always be found such that the phase deviation amount e.g. of the phase deviation signal S stays within certain limits which are much smaller than the phase deviation amount and thus the phase-jitter obtainable with the conventional configuration in FIG. 1b.

Thus, the invention has not only realized that the frequency division performed by the divider DIV1 can be "expanded" into a frequency division using various pairs of frequency division factors according to a predetermined switching pattern, but the invention has also realized that even with a non-optimized switching pattern the phase resolution, the phase-jitter as well as the tracking speed can be improved over the conventional solution in FIG. 1b. According to the invention, it can also be shown that for any combination of frequency division factors an optimized switching pattern is obtainable such that the phase deviation error stays within certain defined limits.

Thus, the invention has expanded the frequency division in the respective dividers in principle as follows:

$$\frac{f1}{p} \equiv z_1 * \frac{f1}{a1} + z_2 * \frac{f1}{a2} + \ldots z_n * \frac{f1}{an}$$

$$\frac{f2}{q} \equiv z_1 * \frac{f2}{b1} + z_2 * \frac{f2}{b2} + \ldots z_n * \frac{f2}{bn}$$

It should be understood that in the above two equations the "≡" sign only schematically illustrates that the original division of f1 by the reference division factor p has been replaced by dividing f1 $z_1$ times by $a_1$, $z_2$ times by $a_2$ ... and $z_n$ times by $a_n$. Likewise, the frequency division of f2 by q has been replaced by dividing f2 $z_1$ times by $b_1$ etc. The length of the switching pattern Z is:

$$Z=z_1+z_2+ \ldots +z_n.$$

For the improvement of the resolution it is only important that in the length Z of the switching pattern there is a selection of pair $P_1$ $z_1$ times, a division using the pair $P_2$ $z_2$ times etc.

For any number of frequency division factors $n \geq 2$ it can be shown that an optimized sequence of switching between the pairs $P_1, P_2, \ldots P_n$ can be found such that the remaining phase deviation error in the phase deviation signal S is minimized. Here, it is assumed that p<q and that p and q do not have a common divider, that $a_1, a_2 \ldots a_n$ and $b_1, b_2, \ldots b_n$ and p, q are natural numbers and $b_1<a_1, b_2<a_2 \ldots a_n<b_n$ (a similar relationship holds for p>q).

Thus, the invention is based on the finding that for any value p/q (with p, q not having a common divider) at least two pairs of divider factors can be found such that the phase resolution before (!) the low pass filter LPF is smaller than in the conventional case in FIG. 1a and that after a length of switching Z the phase error before the low pass filter LPF has a zero value.

By employing the principle of the invention, for any desired phase resolution, tracking speed or locking speed as well as for any requirements of phase-jitter and MTIE (meantime interval error) a number of frequency division pairs $P_n$ ($n \geq 2$) and a switching pattern Z can be found, such that these requirements can always be fulfilled even down to a fine adjustment in steps of ppm. That the adjustment in steps of ppm can already be achieved with n=2 will be further explained below with reference to an embodiment of the invention as is shown in FIG. 2.

Embodiment of the Invention for n=2

An embodiment of the inventive phase locked loop PLL where the first divider has two frequency division factors a and b and said second divider has two frequency division factors c and d and a control means including two selectors SEL1, SEL2 switches between a first pair $P_1$ consisting of frequency division factors a and c and a second pair $P_2$ consisting of frequency division factors b and d is shown in FIG. 2-1. In FIG. 2-1 the same reference numerals as in FIG. 1a, 1b designate the same parts.

As is seen in FIG. 2-1, here the conventional frequency division of the predetermined frequency f1/p has been split into a frequency division of x-times by a and y times by b, e.g. the input signal to the phase comparison means PFD has been expanded to $$f1/p=x*(f1/a)+y(f1/b)$$

Likewise, the other input signal to the phase comparison means PFD is split up into a frequency division of x times by c and y times by d, e.g.

$$f2/q=x*(f2/c)+y*(f2/d).$$

The control means including the selectors SEL1, SEL2 calculates the number x of divisions by a in the first divider and by c in the second divider and the number y of divisions by b in the divider DIV1 and by d in the divider DIV2. As will be seen in the following, x, y and thus the length Z=x+y of the switching pattern can always be calculated on the basis of p, q and the predetermined frequency division factors a, b, c, d. Thus, the selectors SEL1, SEL2 respectively select the pair $P_1$=(a, c) x times and the pair $P_2$=(b, d) y times.

As will be seen from the following mathematical consideration, the phase locked loop according to the embodiment of the invention in FIG. 2-1 does not only allow a significantly higher comparison frequency at the phase comparison means PFD (the phase and frequency discriminator) but also reaches a much better phase resolution for the phase even for any relationship of "p/q" of the frequencies of the reference frequency f1 and the output frequency f2 of the voltage controlled oscillator VCO. Thus, the inventive phase locked loop according to FIG. 2-1 is characterized by the steered selection between two frequency division pairs consisting of a, c and b, d according to the length of the switching pattern or selection queue Z having a predetermined length Z.

As explained before, the frequency division factors a, b, c, d are selected such that they are smaller than p or q, which results in a higher comparison frequency at the phase detector PFD. It should be noted that the frequency division factors a, b, c, d by themselves do not represent exactly the desired frequency ratio "p/q". There is at each comparison a small phase deviation designated with e and g before (!) the low-pass filter. That is, if it is positive (or negative) with the first frequency division factor pair $P_1$=(a, c), then it is negative (positive) when using the second frequency division pair $P_2$=(b, d).

The low pass filter with its integration part generates the resulting phase deviation (error) which becomes zero after any predetermined length Z of the switching pattern which comprises a number x of divisions $P_1$ and a number y of divisions. using $P_2$. The resulting phase deviation has—independent (!) from the cut-off frequency of low pass filter LPF and independent of the selected switching pattern Z (!)—a zero after a length Z. It can be shown that the length of the switching pattern Z can be determined as follows:

$$Z=(x+y)$$

wherein x is the number of times of dividing by the pair $P_1$ and y is the respective number of divisions using $P_2$. Since x and y are natural numbers and also a, b, c, d are natural numbers, the control means CTRL can always calculate the length of the switching pattern Z according to the afore mentioned formula.

Furthermore, when optimizing the switching pattern Z using $P_1$, $P_2$ according to an optimized sequence alternately, the intrinsic phase-jitter amplitude before (!) the low pass filter LPF only fluctuates in an interval of $$(-I, +I) \text{ with } I=Z/2q=(e+g)/2.$$

With the selection of a, b, c, d and the cut-off frequency of the LPF, predetermined phase-jitter requirements in the output of the voltage-controlled amplifier can be satisfied.

Operation of the Embodiment for n=2

As explained above, a control means SEL1, SEL2 is provided for switching between the pairs $P_1$, $P_2$ according to the predetermined switching pattern Z. The switching pattern has a length indicating the switching between $P_1$, $P_2$ to the dividers DIV1, DIV2. As explained, Z indicates that x times $P_1$ is to be selected and y times $P_2$ is to be selected according to a predetermined pattern whose determination will be further explained below with reference to FIG. 2-4.

Assuming that the select signal from the selector SEL1, SEL2 assumes respectively a L level to indicate the selection of $P_1$ and assumes a H level for indicating the selection of $P_2$ to the dividers DIV1, DIV2, then the switching pattern is a series of H, L of a length Z having a predetermined pattern. The switching pattern is the same in the selector SEL1 and the selector SEL2. The next item in the switching pattern (H or L) for respectively selecting the next pair $P_1$, $P_2$ is selected whenever the divider DIV1 or DIV2 outputs a pulse to the phase detector PFD, something that is indicated with the line between the input of the phase detector PFD and the respective selector SEL1, SEL2. With each output pulse, the next division factor in the switching pattern is selected.

Since f1, f2 and the division factors a, b, c, d are different to each other (i.e. p and q are different to each other), it is clear that the switching to the next division factor in each divider DIV1, DIV2 is carried out non-synchronized, since the two pulses respectively input to the phase detectors from DIV1, DIV2 arrive at different times due to the different frequency divisions respectively performed.

On the other hand, there is an overall synchronization when the selector SELL has fully switched through the switching pattern of length Z as is shown with the "reset after length Z" between the selector SEL1 and the selector SEL2 in FIG. 2-1. That is, when the last selection of a division factor a, b due to the last entry in the switching pattern has finished and a further pulse is output by the divider DIV1, then the selector SEL1 again starts the switching pattern from the beginning. Even though the selector SEL2 might not have run through the complete switching pattern at this time, i.e. if the PLL is as yet not locked, the selector SEL2 is also reset to the beginning of the switching pattern due to the reset output by the selector SEL1. That is, when the selector SEL1 has completely run through the switching pattern, then an overall synchronization will be performed such that both selectors SEL1, SEL2 again start the switching pattern synchronously. However, this does not cause any problem since at the most there will be lost one phase comparison when the last pulse from the divider DIV2 has not been applied to the phase detector PFD when the resetting of the switching patterns is performed synchronously in both selectors SEL1, SEL2.

The dividers DIV1, DIV2 can be configured as counters which output a signal after counting up to a predetermined number (e.g. 15). To realize the setting of the division factors a, b, the initial count value is respectively set to a different value, such that the overflow pulse is generated after a number of counts a, b of the input frequency f1 or f2. With such a settable counter, essentially an arbitrary number of different division factors can be set.

Embodiment of the Selector Using a Shift Register

FIG. 2-2 shows an embodiment of the selectors SEL1, SEL2 in FIG. 2-1 by using shift registers SHR1, SHR2. As is indicated in FIG. 2-2, a switch pattern consisting of a series of H, L is loaded in the respective shift register SHR1, SHR2. Whenever a pulse is output by the divider I or the divider II, the switch pattern is shifted 1 bit, such that the next division factor a, b or c, d is selected. The shift register SHR1, SHR2 is formed in a ring configuration, such that the output bit H, L is input to the register again. Therefore, cyclically the same switching pattern is repetitively used for selecting the division factors. As already explained with reference to FIG. 2-1, the next division factor is always selected when the respective divider outputs a next pulse. However, to achieve the overall synchronization, both switching patterns are reset when the shift register SHR1 has been fully switched through (which is indicated with the "reset switching pattern" line between the shift register SHR1 and SHR2).

Embodiment of the Selector Using a Switch Pattern Memory SPM

Figures 1, 3:

FIG. 2-3 shows an embodiment of the selector shown in FIG. 2-1 using. respectively a switch pattern memory SPM and a shift register SHR1, SHR2. The counter CN counts the number of output pulses from the first divider I and reloads the switching pattern from the switching pattern memory into the shift register SHR1 after counting the number of Z pulses in the output from the divider I. As is seen with the connection between the output of the counter CN and the switch pattern memory SPM connected to the shift register SHR2, again after counting the number Z, both shift registers SHR1, SHR2 are reset to the switching pattern stored in the respective switch pattern memory.

Embodiments of the invention using different combinations of values p, q and a, b, c, d and Z will be further explained below with reference to the examples stated in FIG. 3. Hereinafter, it will be shown how the control means CTRL calculates the switching pattern Z for any combination of division factors when each divider DIV1, DIV2 employs two frequency division factors each.

Determination of x, y and the Phase Errors e, g

The control means CTRL starts from considering the conventional configuration in FIG. 1b, i.e. the two frequencies f1, f2 do not coincide, e.g. the frequencies f1/f2 have a predetermined ratio as follows:

$$f2=(p/q)*f1 \tag{1}$$

wherein p and q are assumed to satisfy p<q and where p and q do not have a common divider. In fact, equation (1) above designates the locked state of the phase locked loop PLL when using the two dividers DIV1, DIV2 for the two frequencies f1, f2 as is shown in FIG. 1b. It should be noted that all considerations and derivation shown in the following description equally well apply if the relationship in equation (1) would be defined as: f2=(q/p)*f1. It is here assumed that p and q do not have a common divider since otherwise obviously phase locked loop would go into a locked state after p+q divisions. Although, p<q has been assumed an analogous derivation would hold for p≧q. The control means CTRL assumes that a, b, c, d, p and q are natural numbers with p<q, c<a and d<b.

Considering the original locked state of equation (1) and p, q do not have a common divider, then the control means CTRL realizes that obviously for each predetermined pair of p/q there must be pairs of natural numbers a, c and b, d, respectively, which satisfy the following equations (2), (3):

$$c<p/q*a<c+1 \tag{2}$$

$$d-1<p/q*b<d \tag{3}$$

The equations (2) and (3) are very important, since they signify that for each pair of p/q (without common dividers) there must exist two natural numbers. c, c+1 (d−1, d) between which the ratio p/q multiplied by a (b) must lie. First, the expression in equation (2) essentially describes the range of limits in which the phase deviation can still vary when the first divider divides by a. Likewise, the equation (3) describes the locked condition when the divider DIV1 divides by b. This is an important realization from the requirements of p<q, c<a and d<b.

Since p/q are without common dividers also the rational number (fraction) p/q*a and p/q*b will be rational numbers and the remaining phase error after the phase comparison means PFD can be specified as follows using the equations (2), (3):

$$e=p/q*a-c \tag{4}$$

$$g=d-p/q*b \tag{5}$$

It is seen that the remaining phase error e when using the pair $P_1=(a, c)$ and the remaining phase error g when using the pair $P_2=(b, d)$ are both rational numbers, but are both greater than zero. This generally holds.

Having realized the size of the remaining phase error, the control means CTRL now asks how the pairs $P_1$, $P_2$ should be used in order to have an "overall" average division of p in the first divider DIV1 and an "overall" division of q in the second divider DIV2. That is, the control means CTRL investigates how many times x the pair $P_1$ is to be used and how many times y the second pair $P_2$ is to be used. This can be expressed by the following linear set of equations:

$$a*x+b*y=q \tag{6}$$

$$c*x+d*y=p \tag{7}$$

The question is whether solutions x, y of this set of linear equations can be obtained, i.e. whether (ad−bc)≠0 is satisfied in equation (6), (7). Using the inequalities (4), (5) it is clear that solutions for x, y must exist, since, $$\left( \frac{a}{b} = \frac{\frac{p}{q}a}{\frac{p}{q}b} \stackrel{(4,5)}{=} \frac{e+c}{d-g} \stackrel{e>0}{>} \frac{c}{d-g} \stackrel{>}{\underset{g>0}{>}} \frac{c}{d} \right) \Rightarrow (ad-bc>0) \tag{8}$$

As indicated above, e, g is always greater than 0 and therefore, (ad−bc)>0. Considering this, the general solution for the number of divisions y and the number of divisions of x can be generally determined from equations (6), (7) using (8), (4), (2):

$$y := \frac{ap-cq}{ad-bc} = \frac{qe}{ad-bc} > 0 \tag{9}$$

$$x := \frac{dp-bp}{ad-bc} = \frac{qg}{ad-bc} > 0 \tag{10}$$

Equations (9), (10) are generally valid for all natural numbers a, b, c, d, p and q. However, in their general form it can, of course, not be as yet satisfied that y and x are natural numbers, since (ad−bc) can assume any natural number and therefore x, y can be rational numbers. However, of course it is not possible to perform a switching of e.g. x=1.35 times with the frequency division pair $P_1$.

However, independently from the value. (ad−bc) it can be shown that the phase locked loop can go into a locked state, since the resulting phase error before (!) the low pass filter LPF has zeros, something that can be shown from combining equations (9) and (10) as follows:

$$(x/y=e/g) \Leftrightarrow (xe-yg=0) \tag{13}$$

Generally, the zeros have a distance to each other of $$Z=(a-b)*p+(d-c)*q$$

something that generally follows from equations (4), (5), (9), (10) assuming that Z=x+y.

From equation (9), (10) it immediately follows that natural numbers x, y can be obtained when (ad−bc)=1 is satisfied. Then the distance of the zeros is $$Z=x+y=(a-b)*p+(d-c)*q$$

and the number of divisions x, y are $$x=qg=q*d-p*b$$

$$y=qe=p*a-q*c.$$

That is, the control means CTRL calculates x, y and thus the length of the switching pattern Z from a, b, d, c and from p, q with the restriction (ad−bc)=1. It should be noted that such a switching pattern Z only means that it is requested to select the pair $P_1$=(a, c) x times and to select the pair $P_2$=(b, d) y times. In general, the switching can be performed alternately or according to a predetermined pattern. That is, it is in principle possible to first divide x times using $P_1$ and then to divide y times by $P_2$. In this case, the remaining errors when using x, y would be e.g. respectively, as is indicated in equations (4), (5). However, when optimizing the switching pattern of switching between $P_1$, $P_2$ the remaining phase error and thus the maximum intrinsic phase-jitter amplitude before (!) the low pass filter LPF fluctuates in an interval of $$[-I,+I] \text{ with } I=(g+e)/2=Z/2q.$$

It is important to realize that with the selection of Z (at given q) there can be obtained already a resultant phase error before the low pass filter LPF which fluctuates to a minimum degree and still allows a locking of the phase locked loop. If even before the low-pass filter the average change of the phase error is minimal, the requirements on the cut-off frequency of the low-pass filter LPF can be relaxed.

In particular, the phase error variations before the LPF can be so minimal that the corresponding changes made by the voltage-controlled oscillator after the phase deviation signal S (e.g.) has been integrated by the LPF will be so small or even insignificant so that the phase-jitter caused by this is extremely low. The values can be selected, such that the actual changes that occur in the controlled voltage at the input of the voltage-controlled oscillator would generate alterations of the output frequency f2 which would even be smaller than the own intrinsic variations of the VCO itself. Examples of this fact will be described below with reference to FIG. 3.

However, it is not necessary to impose the restriction (ad−bc)=1 on the values a, b, c, d to achieve that a solution of equation (6), (7) can always be obtained with x, y in natural numbers. For the case of (ad−bc)>1 the linear set of equations (6), (7) can be rescaled to still allow a general solution, namely $$a*\bar{x}+b*\bar{y} \text{ with } \bar{q}:=q*(ad-bc) \tag{11}$$

$$c*\bar{x}+d*\bar{y} \text{ with } \bar{p}:=p*(ad-bc) \tag{12}$$

Now the solutions $\bar{x}$ and $\bar{y}$ of the linear set of equations (11), (12) are also natural numbers because of equation (9), (10). Namely, $\bar{x}$ and $\bar{y}$ can now be determined as $$\bar{x}=dq-bp>0$$

$$\bar{y}=ap-cq>0$$

In this case, of course the length of the switching pattern is Z=$\bar{x}$+$\bar{y}$ e.g. the already afore mentioned length of the switching pattern Z is in general $$Z=(a-b)*p+(d-c)*q=\bar{x}+\bar{y}$$

Thus, it has been shown that for any previously given value p, q (p<q) and for any desired frequency division factors a, b, c, d with c≦a and d≦b always the length Z or the values x, y are positive natural numbers, wherein the phase error before the low pass filter LPF has respectively a zero value after a length Z of switchings.

Embodiment for n>2

Although in the afore going description only the case of n=2 is treated to illustrate that always a length Z consisting of natural numbers for switching between two pairs of frequency division factors (a, c) and (b, d) can be found, it may be noted that this is analogously true also for the general case of using n>2 pairs of frequency division factors. Each frequency division factor a considered above can, of course, be decomposed into linear combinations of products of natural numbers, for example $$a=i*j+k*l$$

Therefore, what was specifically explained above for the case n=2 also generally holds for n>2.

Determination of the Switching Pattern

As explained above, generally the relationship xe−yg=0 is satisfied. This is also independent of the fact how the switching pattern itself is selected. Even when selecting an unsuitable switching pattern (e.g. successively x times $P_1$=(a, c) and thereafter y times $P_2$=(b, d)), the resulting phase error in the output of the phase detector PFD is below xe=yg. The switching pattern can always be determined such that the resulting phase error remains below I=(e+g)/2.

If y/x=1 (i.e. the number of divisions using $P_1$ equals the number of divisions using $P_2$), then obviously the mean phase error over the length Z of switchings is minimized when using alternately $P_1$, $P_2$, i.e. using a basic pattern $F_1$=HL successively. This can be extended to a general case to determine the general switching pattern for values y/x≠1 as follows:

$$\text{case } 1: 1 = y/x \text{ gives pattern } \{F_1\} \tag{14}$$

$$\text{with } F_1 = HL$$

$$\text{case } 2: 2 = y/x \text{ gives pattern } \{F_2\}$$

$$\text{with } F_2 = HLH$$

$$\text{case } 2N:2N = y/x \text{ gives pattern } \{F_{2N}\}$$

-continued $$\text{with } F_{2N} = H(N)LH(N)$$

$$\text{case } 2N+1:2N+1 = y/x \text{ gives pattern } \{F_{2N+1}\}$$

$$\text{with } F_{2N+1} = H(N)LH(N+1)$$

H(N) designates N-repetitions of H, i.e. H(2)=HH. It is noted that the resulting phase error remains below (e+g)/2 for each of the aforementioned patterns $\{F_e\}$.

In the general case, n=y/x<m with m=n+1, the general pattern $\{F_{n,m;x,y}\}$ consists of: (mx−y) times $F_n$ and (y−nx) times $F_m$. For interleaving $F_i$ and $F_{i+1}$ the general rule is given as follows:

After [(mx−y)/(y−nx)] times $F_i$ the pattern $F_{i+1}$ is used once. Therefore, an optimized switching pattern can always be found to keep the phase error below (e+g)/2.

Designing the Phase-Locked Loop

FIG. 2-4 shows an algorithm how the phase-locked loop is designed regarding the switching pattern. First, in step S2, the factors p, q are determined from the preselected frequencies f1, f2. In step S3, the division factors a, b, c, d are selected according to equations (2), (3). In step S4, the phase error e, g is calculated according to equations (4), (5). In step S5, the calculated phase errors e, g are checked with respect to desired values in order to determine whether e, g is acceptable. If in step S5, the resulting phase error e, g is not acceptable, new factors a, b, c, d are selected in step S3. If the phase error e, g is acceptable in step S5, then in step S6 the numbers x, y are calculated from equations (9), (10). In step S7, the switching pattern $\{F_{n,m;x,y}\}$ is determined and in step S8, the values of the selected division factors a, b, c, d and the switching pattern F are output to the selectors SEL1, SEL2 as is indicated in FIG. 2-1.

Hereinafter, specific examples using n=2 will be illustrated with reference to FIG. 3. With reference to FIG. 3 also an optimal switching pattern will be discussed.

Examples for n=2

The examples EX1, EX2, EX3, EX4 in FIG. 3-1 relate to a choice of the predetermined frequency f2 and the reference frequency f1 as f1/f2=q/p=6783/2990 according to the above mentioned equation (1).

In example EX1: Fast tracking I (only for illustration purposes and no design suggestion) the comparison frequency at the phase detection means PFD is maximum and equal to f1 since c=d=1. First, the fastest possible tracing is achieved in example EX1. However, there are relatively large phase errors e, g before the low pass filter LPF. In this case, the cut-off frequency of the low-pass filter LPF will determine the phase-jitter suppression and therefore the intrinsic phase-jitter generated by the voltage controlled oscillator itself. That is, in this case, the cut-off frequency of the low-pass filter LPF must be low enough and for a fixed cut-off frequency there may still be a large jitter in the output frequency f2.

Lower phase errors e, g may be achieved in example EX2: Fast tracking II and example EX3: jitter reduced I. In the example EX2 a comparatively fast tracing speed can still be obtained by selecting the values of c=3 and d=4. In the example EX2 the jitter amplitudes after the phase detection means PFD, i.e. before the low pass filter LPF are 117 mUi and 20 mUi, respectively for EX2, EX3 (mUi=milli Unit interval which is dimensionless and the measure for the jitter defined as: average phase deviation/period of the signal).

In the example EX4: Jitter reduced II the phase errors e, g are very small, i.e. the jitter amplitudes after the phase detector PFD and before the low pass filter LPF are already as small as 4 mUi. Even without integrating such small jitter amplitudes by the low pass filter LPF the change of the output. frequency f2 caused thereby is smaller than the intrinsic jitter of most oscillators. As is seen in example EX4, this can already be achieved with frequency division factors of only 2 to 3 digits. Using the conventional example in FIG. 1b, p=2990*$10^6$, that is, one would have to use a frequency division factor p which comprises 9 or 10 digits.

In the example EX4 the reference frequency output by the first divider DIV1 to the phase detector PFD is at least ¼ or ¹⁄₂₆ of f1. This is a factor of 750 or 115, respectively, higher than using p=2990 in the conventional case. Thus, the phase resolution is—independent of the cut-off frequency and the amplification of the low pass filter (the low pass filter within the (phase detector PFD and the actual low pass filter LPF)— also larger by this factor. Additionally, the cut-off frequency of the low pass filters can therefore also be increased by this factor which leads to a simplified filter design.

Switching Pattern for Example EX4

FIG. 3-2 shows a switching pattern Z for selecting the frequency division pairs $P_1$, $P_2$ for the example EX4 in FIG. 3-1. If in FIG. 3-2 the control means outputs a "H" to the selectors SEL1, SEL2 in FIG. 2, then the divider DIV1 divides by b (in the example EX4 by 245) and the divider DIV2 divides by d (in the example EX4 by 108). When the selectors SEL1, SEL2 output a "L" to the dividers DIV1, DIV2, the frequency division factor pair $P_1$ is selected, namely a=152 and c=67. When "H" is output, $P_2$=(b, c) is selected. As indicated in FIG. 3-2, after Z=x+y=33 divisions, the resulting phase error before (!) the low pass filter has a zero as was discussed above.

As is seen in FIG. 3-2, the switching pattern Z used in the example alternately uses H and L, wherein one basic pattern $F_1F_1F_2$ ("HLHLHLH") is used four times and another basic pattern $F_1F_2$ ("HLHLH") is used only once. As indicated in FIG. 3-2, the switching pattern Z corresponds to the optimized switching pattern Z, where the resulting phase error and thus the maximum intrinsic jitter amplitude before the low pass filter LPF only fluctuates in an interval of [+I, −I]. A non-optimized switching pattern Z would be for example x-times a "H" and y-times a "L" and then again x-times a "H" etc. However, it will be appreciated that it is always possible to find a switching pattern Z which consists of basic switching patterns $F_i$ as explained above to minimize the phase error at the output of the phase detector in the best possible manner. If the switching pattern Z has been optimized in this way, the switching pattern Z can most easily be realized by reading out $F_i$ patterns from a memory or it can be realized by state machines using cascaded states in a more intelligent solution (FPGA-Design).

In the example EX4 (x=14 and y=19), the switching pattern $\{F_{1,2;14,19}\}$ thus consists of $F_{1,2;14,19}$ with 9 times $F_1$ and 5 times $F_2$ as explained for the general case above. This results in the switching pattern as shown in FIG. 3-2.

The interleaving pattern [(mx−y)/(y−nx)] in the example EX4 is 9/5=1.8. In FIG. 3-2, the (symmetrical) sequence 2 2 1 2 2 has been selected for the five distances. The resulting phase error for the optimized switch pattern in FIG. 3-2 is always below (e+g)/2.

It should be noted that even for the general case the sequence of distances can be selected, such that the resulting phase error is minimal (smaller than (e+g)/2). As shown in the general derivation above, each switching pattern, even a very long switching pattern, consists of only two different partial patterns. It can be estimated that each partial pattern is usually shorter than 10 switchings and in the example EX4, there are only two and three steps, respectively. Furthermore, based on the above explanations, the generation of a switching pattern with a low resulting phase error is already determined sufficiently by x, y.

Examples EX5, EX6 respectively show situations where not the fast tracking speed is the center of attention but the phase or frequency resolution in steps of ppm (parts per million). As is seen in examples EX5, EX6 the length of the switching pattern Z is extremely long, however, the resulting phase errors e, g are comparatively low. Only division factors a, b, c, d with two digits need to be used. Therefore, examples EX5, EX6 really relate to the requirement of having an oscillator with a high stability which is nonetheless very finely tunable (i.e. in the range of Hz to milli Hz). A low cut-off frequency for the LPF can be selected.

Examples EX5, EX6 illustrate a case where an extremely fine resolution of the phase, i.e. a very high number of phase comparisons should be performed. Therefore, in examples EX5, EX6 the values for p, q in the examples EX1–EX4 have been respectively multiplied by 1000 and 1000000 respectively. Of course, the tracking speed and the locking speed is extremely low, however, phase and frequency adjustment in steps of ppm (parts per million) can be achieved due to the selected overall reference division factor p and the reference division factor q. However, it is still seen that only frequency division factors a, b, c, d with two digits need to be used, namely the same as those used in the example EX3. This results in nearly the same phase errors e, g, however, including the possibility of having adjustment of the output frequency f2 in steps of ppm. In accordance with the jitter requirements, the cut-off frequency of the low pass filter LPF is to be adapted to the (considerable) length of the switching pattern Z, i.e. that over a long period of time an integration needs to be performed, however, it is assumed that even if the cut-off frequency of the low pass filter LPF is kept as in example EX3, a phase jitter caused by the switching pattern Z will occur in the output frequency f2 which, however, lies below (i.e. milli Hz to Hz) the intrinsic jitter of the voltage-controlled oscillator VCO, such that no problems are experienced.

The MTIE and the jitter still remain in the order of mUi's. Admittedly, the required low-cut off frequency is here transferred into an extremely long switching pattern Z. However, even when selecting frequency division factors a, b, c, d with only two digits, this long resulting switching pattern Z still ensures that a phase comparison in steps of ppm can be performed at such high frequencies of f1/f2 (p/q). The control means is only required to generate a long "LH" sequence (Z≈10$^8$ switchings) until the phase error still reaches a zero after the phase detector PFD and before (!) the low pass filter. Therefore, a fine adjustment of the phase or frequency in steps of ppm can be achieved and the phase locked loop still enters a locked state, even if it does so only after a considerably low tracking speed (long switching pattern Z).

Industrial Applicability

As explained above, the phase locked loop of the invention allows a significantly higher comparison frequency at the phase detector PFD and thus achieves a significantly improved phase resolution, something that can be achieved at any arbitrary frequency ratio (p/q=f2/f1). Thus, the inventive phase locked loop PLL can be used in any application where a desired output frequency f2 needs to be locked to a reference frequency f1 either at a very high tracking speed or with an extremely high phase resolution and low phase jitter.

It is evident that on the basis of the teachings disclosed herein various modifications and variations can be carried out by a skilled person and that the invention is not restricted to any particular embodiment or example described herein. Therefore, all such variations and modifications are intended to fall within the scope of protection as defined in the claims.

Reference numerals in the claims only serve illustration purposes and do not limit the scope of protection of these claims.

What is claimed is:

1. A phase-locked loop for generating an output signal of a predetermined frequency and a locked phase relative to a reference signal of a predetermined reference frequency, comprising:

a) a first divider for frequency dividing said reference signal;
   b) a second divider for frequency dividing said output signal;
   c) a phase detection means for detecting a phase deviation between said divided reference signal and said divided output signal and for outputting a corresponding phase deviation signal;
   d) an oscillator means for outputting said output signal with a frequency corresponding to said phase deviation indicated by said phase deviation signal; wherein
   e) said first divider has two different selectable frequency division factors a and b;
   f) said second divider has two different selectable frequency division factors c and d; and
   g) control means are provided
      g1) for respectively selecting a frequency division factor pair consisting of frequency division factors a and c or a frequency division factor pair consisting of frequency division factors b and d, respectively of said first and second divider,
      g2) for switching between said two different frequency division factor pairs a,c and b,d according to a predetermined switching pattern of a predetermined length; characterized in that
   h) a reference division factor p is defined for said first divider and a reference division factor q is defined for said second divider, wherein the following equation (1) is satisfied $$f2 = p/q * f1 \tag{1}$$

with f2 being said output frequency and f1 being said reference frequency, p, q, a, b, c, d being natural numbers, p and q being without common dividers, and p, q, a, b, c, d are selected such that the following relations are satisfied: p<q, c<a, d<b and a, b, c, d<p and a, b, c, d<q; and wherein i) in said switching pattern a number x of divisions using a selection of said first pair equals $$x = (ap - cq)/(ad - bc) \tag{10}$$

and a number y of divisions using a selection of said second pair equals $$y = (dq - bp)/(ad - bc) \tag{11}$$

wherein x, y both are greater than 0.

2. A phase-locked loop according to claim 1, characterized in that a, b, c, d are selected such that the following relations (2) and (3) are satisfied:

$$c < p/q * a < c+1 \tag{2}$$

$$d-1 < p/q * b < d \tag{3}$$

3. A phase-locked loop according to claim 2, characterized in that a phase deviation e of said phase deviation signal is $$e = p/q * a - c \quad (4)$$

when said first pair a, c is selected and a phase deviation g of said phase deviation signal is $$g = d - p/q * b \quad (5)$$

when said second pair b, d is selected, wherein e and g are either both positive or both negative, wherein equations (4), (5) imply that (ad−cb) is unequal 0.

4. A phase-locked loop according to claim 1, characterized in that a, b, c, d are selected such that $$ab - cd = 1$$

is satisfied, wherein x, y are natural numbers.

5. A phase-locked loop according to claim 4, characterized in that said phase deviation e, g equals 0 after a length Z of said switching pattern with Z=x+y=(a−b)*p+(d−c)*q wherein the following relation (13) is satisfied:

$$x*e - y*g = 0 \quad (13)$$

wherein said phase-locked loop is locked.

6. A phase-locked loop according to claim 5, characterized in that for an optimized switching pattern said phase deviation fluctuates in an interval with I=(g+e)/2+Z/2q.

7. A phase-locked loop according to claim 1, characterized in that when a, b, c, d are selected such that ad−bc>1, a length Z of said switching pattern is Z=(x'+y') with x'=d*q−b*p>0 and y'=a*p c*q>0 with x' and y' being natural numbers.

8. A phase locked-loop according to claim 1, characterized in that said oscillator means comprises a low pass filter having a predetermined cut-off frequency and a voltage controlled oscillator.

9. A phase-locked loop according to claim 1, characterized in that said control means comprises two selectors and said selectors are respectively triggered by a pulse output by said respective divider to select a next frequency division factor according to a next entry in said switching pattern and after said first selector has finished switching between said frequency division factors over said predetermined length of switchings according to said predetermined switching pattern, both selectors synchronously restart a switching beginning with the first entry in said switching pattern.

10. A phase-locked loop according to claim 1, characterized in that said control means comprises two selectors and said selectors each comprise a shift register including said predetermined switching pattern, wherein said shift registers are respectively triggered by a pulse output by said respective divider.

11. A phase-locked loop according to claim 1, characterized in that said control means comprises two selectors and said selectors respectively comprise a shift register and a switch pattern memory, and a counter is provided for counting the number of pulses of said divider, wherein said counter reloads a switching pattern stored in said switch pattern memory, when the count value exceeds the number of switchings in said length of said switching pattern.

12. A phase-locked loop according to claim 1, characterized in that said dividers comprise settable counters.

13. A phase-locked loop according to claim 7, characterized in that said switching pattern is defined as $F_{n,m;x,y}$ and contains (mx−y) times a switching sequence $F_n$ and (y−nx) times a switching pattern $F_m$ for n<y/x<m with m=n+1, wherein $F_{n,m}$ are generally given from $F_1$=HL, $F_{2N}$=H(N)LH(N) and $F_{2N+1}$=H(N)LH(N+1), where H indicates a selection of division factors b;d and L indicates a selection of division factors a, c and H(N) indicates N repetitions of H; and an interleaving sequence of sequences $F_n$ and $F_m$ is selected such that after (mx−y)/(y−nx) times $F_n$ once $F_m$ is used.

14. A phase-locked loop according to claim 1, characterized in that downstream of said oscillator means another phase-locked loop having features a)−i) is provided having as input said output signal of said oscillator means.

15. A phase-locked loop according to claim 7, characterized in that said control means comprises a selector means for selecting said first pair for frequency division in said first and second dividers when said switch pattern indicates a L and for selecting said second pair for frequency division in said first and second dividers when said switch pattern indicates a H.

16. A phase-locked loop according to claim 12, characterized in that p=2990, q=6783, a=152, b=245, c=67, d=108, x=14, y=19 and a length Z of said switching pattern is 33.

17. A phase-locked loop according to claim 16, characterized in that an optimized switching pattern stored in a switching pattern memory of said control means for said values given in claim 16 is:

$$F_1F_1F_2\ F_1F_1F_2\ F_1F_2\ F_1F_1F_2\ F_1F_1F_2.$$

18. A phase-locked loop (PLL) according to claim 1, wherein said control means comprises two selectors (SEL1, SEL2) and said selectors (SEL1, SEL2) are respectively triggered by a pulse output by said respective divider (DIV1, DIV2) to select a next frequency division factor (a or b; c or d) according to a next entry in said switching pattern and after said first selector (SEL1) has finished switching between said frequency division factors (a and b) over said predetermined length (Z) of switchings according to said predetermined switching pattern, both selectors synchronously restart a switching beginning with the first entry in said switching pattern.

19. A phase-locked loop (PLL) according to claim 1, wherein said control means comprises two selectors (SEL1, SEL2) and said selectors (SEL1, SEL2) each comprise a shift register (SHR1, SHR2) including said predetermined switching pattern (Z), wherein said shift registers are respectively triggered by a pulse output by said respective divider DIV1 or DIV2).

20. A phase-locked loop (PLL) according to claim 1, wherein said control means comprises two selectors (SEL1, SEL2) and said selectors (SEL1, SEL2) respectively comprise a shift register and a switch pattern memory, and a counter (CN) is provided for counting the number of pulses of said divider (SEL1), wherein said counter (CN) reloads a switching pattern (Z) stored in said switch pattern memory (SPM), when the count value exceeds the number of switchings (Z) in said length (Z) of said switching pattern.

21. A phase-locked loop (PLL) according to claim 7, wherein said switching pattern is defined as $F_{n, m; x, y}$ and contains (mx−y) times a switching sequence $F_n$ and (y−nx) times a switching pattern $F_m$ for n<y/x<m with m=n+1, wherein $F_{n,m}$ are generally given from $F_1$=H., $F_2$=HLH, $F_{2n}$=H(N)LH(N) and $F_{2N+1}$=H(N)LH(N+1), wherein H indicates a selection of division factors b;d and L indicates a selection of divisions factors a, c and H(N) indicates N repetitions of H; and an interleaving sequence of sequences $F_n$ and $F_m$ is selected such that after (mx−y)/(y−nx) times $F_n$ once $F_m$ is used.

* * * * *